(12) United States Patent
Kemp et al.

(10) Patent No.: US 9,182,246 B2
(45) Date of Patent: Nov. 10, 2015

(54) METHOD, SYSTEM AND SENSOR FOR IDENTIFYING AN ELECTRICAL DEVICE CONNECTED TO A MAINS GRID

(75) Inventors: Thomas Kemp, Esslingen (DE);
Carsten Merkle, Pluederhausen (DE);
Andreas Schwager, Waiblingen (DE);
Dietmar Schill, Winnenden (DE);
Lothar Stadelmeier, Stuttgart (DE);
Ben Eitel, Gaertringen (DE)

(73) Assignee: Sony Corporation, Tokyo (JP)

( * ) Notice: Subject to any disclaimer, the term of this patent is extended or adjusted under 35 U.S.C. 154(b) by 238 days.

(21) Appl. No.: 12/987,357

(22) Filed: Jan. 10, 2011

(65) Prior Publication Data

US 2011/0196634 A1    Aug. 11, 2011

(30) Foreign Application Priority Data

Jan. 25, 2010   (EP) .................................... 10000715

(51) Int. Cl.
*G01R 25/00* (2006.01)
*G01R 21/06* (2006.01)
*G01D 4/00* (2006.01)
(Continued)

(52) U.S. Cl.
CPC .............. *G01D 4/00* (2013.01); *G01R 19/2513* (2013.01); *H02J 13/0006* (2013.01); *Y02B 70/3266* (2013.01); *Y04S 20/242* (2013.01); *Y04S 20/38* (2013.01)

(58) Field of Classification Search
CPC .......... G01D 4/002; G01D 4/00; Y04S 20/16; Y04S 20/18; Y04S 20/42; Y04S 20/38; Y04S 20/242; G06F 19/00; G01R 31/00; G01R 19/2513; H02J 1/00; H02J 13/00; H02J 13/0006; Y02B 70/3266
USPC .................................... 702/65, 48, 57, 61, 60
See application file for complete search history.

(56) References Cited

U.S. PATENT DOCUMENTS

| 4,858,141 | A | * | 8/1989 | Hart et al. ....................... 702/61 |
| 5,412,343 | A | * | 5/1995 | Rijns .............................. 330/253 |
| 7,233,625 | B2 | | 6/2007 | Ma et al. |

(Continued)

FOREIGN PATENT DOCUMENTS

| CN | 2481030 Y | 3/2002 |
| CN | 101089837 A | 12/2007 |

(Continued)

OTHER PUBLICATIONS

STIC Search Report.*

(Continued)

*Primary Examiner* — Eliseo Ramos Feliciano
*Assistant Examiner* — Yoshihisa Ishizuka
(74) *Attorney, Agent, or Firm* — Oblon, McClelland, Maier & Neustadt, L.L.P.

(57) ABSTRACT

A method for identifying an electrical device connected to a mains grid is provided, the method comprising measuring at least one electrical characteristic on the mains grid with a sensor connected to a socket of the mains grid; comparing the at least one electrical characteristic with a plurality of stored candidate electrical characteristics each corresponding to one of a plurality of candidate electrical devices; and identifying the electrical device based on the stored candidate electrical characteristic that is closest to the at least one electrical characteristic. A corresponding system and a corresponding sensor are provided as well.

21 Claims, 7 Drawing Sheets

(51) Int. Cl.
*H02J 13/00* (2006.01)
*G01R 19/25* (2006.01)

(56) References Cited

U.S. PATENT DOCUMENTS

| | | | |
|---|---|---|---|
| 8,090,480 B2* | 1/2012 | Brumfield et al. | 700/296 |
| 8,311,754 B2* | 11/2012 | Alles | 702/61 |
| 2004/0013084 A1 | 1/2004 | Thomas et al. | |
| 2007/0014393 A1* | 1/2007 | Jensen et al. | 379/30 |
| 2008/0010406 A1 | 1/2008 | Kang et al. | |
| 2008/0313324 A1 | 12/2008 | Wong et al. | |
| 2009/0045804 A1* | 2/2009 | Durling et al. | 324/140 R |
| 2010/0070214 A1* | 3/2010 | Hyde et al. | 702/61 |

FOREIGN PATENT DOCUMENTS

| | | |
|---|---|---|
| EP | 1650921 | 4/2006 |
| WO | WO 02/084949 A1 | 10/2002 |
| WO | WO 2009/125659 A1 | 10/2009 |
| WO | WO 2011/035301 A2 | 3/2011 |

OTHER PUBLICATIONS

Masahito Ito, et al., "A Method and System of Appliance Detection and Control Using Power Consumption Measurement", Transactions of Information Processing Society of Japan, vol. 44, No. 1, Jan. 2003, pp. 95-105 (with English Abstract).

Hyun Sang Cho, et al, "Simple and Robust Method for Detecting the Electrical Appliances Using Markers and Programmable Logic Devices", The 13th IEEE International Symposium on Consumer Electronics (ISCE2009), pp. 334-338.

Henrique Serra, et al., "Domestic Power Consumption Measurement and Automatic Home Appliance Detection", Sep. 1-3, 2005, WISP 2005, IEEE 2005, pp. 128-132.

Rear Tutorial—Clarity Wiki, http://www.clarity-centre.org/claritywiki/index.php/REAR_Tutorial[Jul. 1, 2010 14:38:13], 5 pages.

U.S. Appl. No. 13/502,774, filed Jun. 11, 2012, Schwager, et al.
U.S. Appl. No. 14/178,606, filed Feb. 12, 2014, Dilly, et al.
Office Action dated Feb. 8, 2014, in Chinese Patent Application No. 201110027027.6, filed Jan. 21, 2011 (English-translation).

* cited by examiner

METHOD, SYSTEM AND SENSOR FOR IDENTIFYING AN ELECTRICAL DEVICE CONNECTED TO A MAINS GRID

An embodiment of the invention relates to a method, a system and a sensor for identifying an electrical device connected to a mains grid.

BACKGROUND

In any household many power consumers are connected to a mains grid. Often, the user of the power consumers does not know which devices are connected and consume power.

In order for people to use less energy/electricity in their homes, they need an itemized bill that clearly shows the usage and energy cost for each of their appliances. Without itemized data, consumers can take action to conserve, by either installing more energy efficient appliances (air conditioners, close washers/dryers, hot tubes, ovens, lighting, etc.) for changing their usage patterns in areas where pricing of energy/electricity varies by time of day, of simply turning loads off when not in use. The problem is that people do not want to incur the significant expense required to install power sensors on each of their appliances in the electric loads.

There is a need for an easy detection and analysis of appliances connected to the mains grid.

It is an object of the invention to provide a method, a system and a sensor for identifying an electrical device connected to a mains grid that is easy to use.

The object of the invention is solved by a method for identifying an electrical device according to claim 1, a system for identifying an electrical device connected to a mains grid according to claim 7 and by a sensor for identifying an electrical device connected to a mains grid according to claim 11.

Further details of the invention will become apparent from a consideration of the drawings and ensuing description.

BRIEF DESCRIPTION OF THE SEVERAL VIEWS OF THE DRAWINGS

The accompanying drawings are included to provide a further understanding of embodiments and are incorporated in a constitute part of the specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following, embodiments of the invention are described. It is important to note that all described embodiments in the following may be combined in any way, i.e. there is no limitation that certain described embodiments may not be combined with others. Further, it should be noted that the same reference signs throughout the Figures denotes same or similar elements.

It is to be understood that other embodiments may be utilized and structural or logical changes may be made without departing from the scope of the invention. The following detailed description, therefore, is not to be taken in a limiting sense, and the scope of the present invention is defined by the appended claims.

Figure 1:
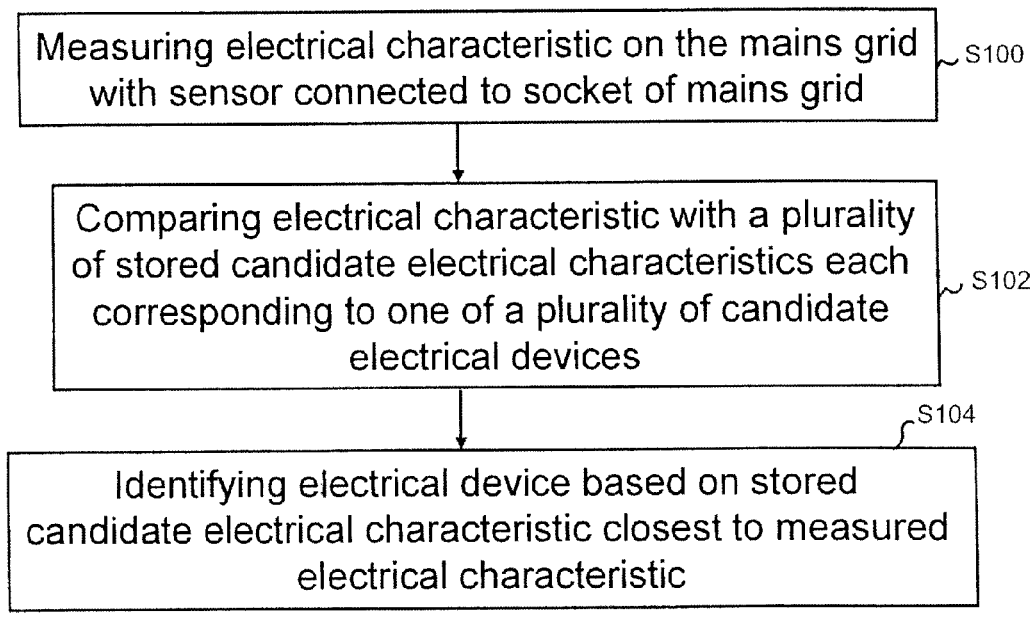
FIG. 1 is a simplified flow chart illustrating a method according to an embodiment of the invention.

In FIG. 1 steps of a method according to an embodiment of the invention are depicted.

In step S100 at least one electrical characteristic on a mains grid is measured with a sensor connected to a socket of the mains grid. The socket might also be referred to as "outlet" or "AC power plug".

The electrical characteristic might be one of electrical power, real power, reactive power, apparent power, current, voltage, channel transfer function between any pair of sockets, frequency intermodulation, input reflection coefficient, noise, line cycle frequency, supply voltage at line cycle, or identification code or any other suitable electrical characteristic.

In addition, by measuring electrical characteristics it is also possible to derive mechanical or other physical characteristics, for instance measuring distances by e.g. measuring the timings when a signal is returned. The interpretation of the results (reflections) indicates the distance between points.

In step S102 the at least one electrical characteristic is compared with a plurality of stored candidate electrical characteristics each corresponding to one of the plurality of candidate electrical devices. The candidate electrical devices might include any possible appliance, e.g. a light bulb, a refrigerator, a vacuum cleaner, a washing machine, a TV set, a video recorder, a DVD-player, an air condition, an electrical oven, a coffee machine, a toaster, a personal computer, a water boiler, an electric kettle, a tuner, a CD-player, an internet switch, a set-top box, a satellite dish, a battery charging device, an electrical heating, an electrical underfloor heating, a phone, an intercommunication device (intercom) or doorphone, an electrical toothbrush, a shaver, an electrical roller shutter, a garden water spring, an aquarium water pump etc. and also e.g. electric cars that might be connected to the mains grid of a household.

In step S104 the electrical device is identified based on the stored candidate electrical characteristic that is closest to the at least one electrical characteristic measured in step S100. A closest electrical characteristic might be e.g. the closest actual value or the most similar time behavior of the electrical characteristic.

With the proposed method several electrical properties might be recorded at the mains grid. The collection of many properties gives a unique fingerprint of each device connected to the mains grid. Interpretation of the fingerprint and the individual properties allows identifying devices connected to the mains and its location where it is connected to.

For the electrical characteristics listed above the absolute characteristic as well as the change of the characteristic (differential behavior) could be monitored. All of the electrical characteristics could be monitored by one or more devices or sensors. The information from multiple or sensor devices might be shared and collected by a central unit deriving more information out of the collection of information.

Figure 2:
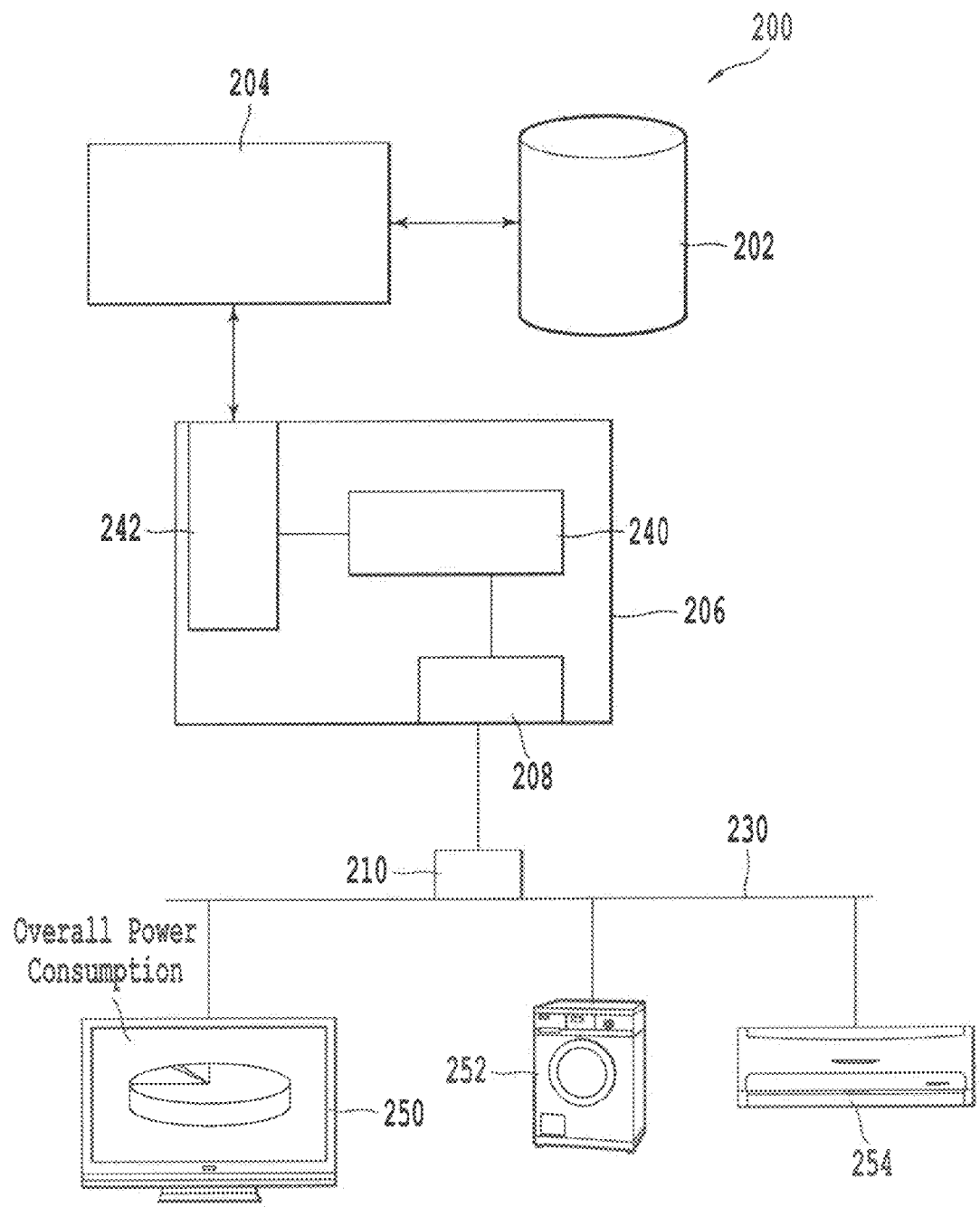
FIG. 2 is a schematic block diagram illustrating a system according to a further embodiment of the invention.

In FIG. 2 a schematic overview over a system 200 for identifying an electrical device is depicted. The system 200 comprises a database 202 including a plurality of stored candidate electrical characteristics each corresponding to one of a plurality of candidate electrical devices. The system further includes a processor 204 and a sensor 206, the sensor 206 including a connector 208 configured to connect the sensor 206 to a socket 210 of the mains grid 230. The sensor 206 further includes a measurement unit 240 configured to measure at least one electrical characteristic on the mains grid 230. The sensor 206 further includes a transmitter 242 configured to transmit at least one electrical characteristic to the processor 204. The processor 204 is configured to compare the at least one electrical characteristic with a plurality of candidate electrical devices and to identify the electrical device based on the stored candidate electrical characteristic that discloses to the measured electrical characteristic. At the mains grid 230 a plurality electrical devices or appliances, e.g. a TV set 250, a washing machine 252 and an air condition 254 is connected. Of course, other appliances like e.g. a light bulb, a refrigerator, a vacuum cleaner, a video recorder, a DVD-player, an electrical oven, a coffee machine, a toaster, a personal computer, a water boiler, an electric kettle, a tuner, a CD-player, an internet switch, a set-top box, etc. and also e.g. electric cars might be connected to the mains grid as well.

Figure 3:
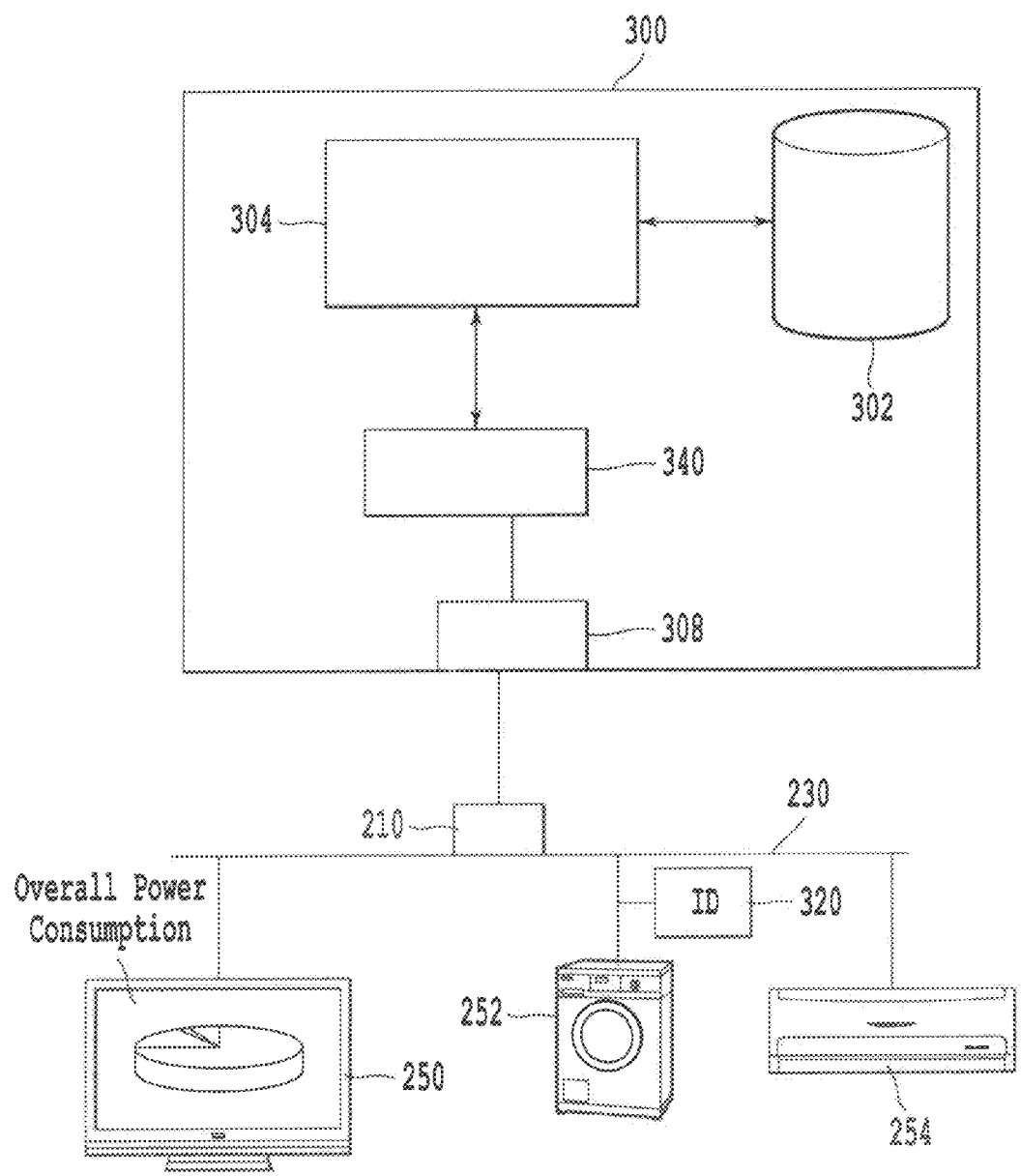
FIG. 3 is a schematic block diagram illustrating a sensor according to a further embodiment of the invention.

In FIG. 3 a schematic block diagram of a sensor 300 for identifying an electrical device is depicted. The sensor 300 comprises a database 302 including a plurality of stored candidate electrical characteristics each corresponding to one of a plurality of candidate electrical devices. The sensor further includes a processor 304 and a connector 308 configured to connect the sensor 300 to the socket 210 of the mains grid 230. The sensor 300 further includes a measurement unit 340 configured to measure at least one electrical characteristic on the mains grid 230. The processor 304 is configured to compare the at least one electrical characteristic with a plurality of candidate electrical devices and to identify the electrical device based on the stored candidate electrical characteristic that discloses to the measured electrical characteristic. At the mains grid 230 a plurality electrical devices or appliances, e.g. a TV set 250, a washing machine 252 and an air condition 254 are connected. Of course, other appliances like e.g. a light bulb, a refrigerator, a vacuum cleaner, a video recorder, a DVD-player, an electrical oven, a coffee machine, a toaster, a personal computer, a water boiler, an electric kettle, a tuner, a CD-player, an internet switch, a set-top box, etc. and also e.g. electric cars might be connected to the mains grid as well.

With the system 200 or with the sensor 300 one or more of a plurality of electrical characteristics might be measured and recorded on the mains grid. Since the sensor 300 or the sensor 206 include a respective connector 208, 308 the sensors 300, 206 are easily connectable to the mains grid 230, without the need to modify the infrastructure of the mains grid.

With the help of the electrical characteristics it is possible to derive a unique fingerprint for each electrical device connected to the mains grid 230. Interpretation of the fingerprint and/or the individual electrical characteristics allows identifying the electrical devices connected to the mains grid 230 and its location, where the electrical device is connected to the mains grid 230.

In the following examples are given for possible electrical characteristics that might be monitored or measured. As already explained absolute characteristics as well as differential development of the characteristics might be investigated. Electrical devices might have an identification code ID unit 320 implemented, and transmit the identification code ID via power line (similar to RFID technology) on request. The power line identification code unit 320 (such as RFID) might be a sticker to a power cord of the device. It is also possible to integrate the power line identification code into a power plug of the electrical device. The device that transmits the identification code might be a passive device supplied via an electromagnetic field of the 50/60 Hz line cycle. The power line identification code might include load (power) consumption of the electrical device.

Figure 4:
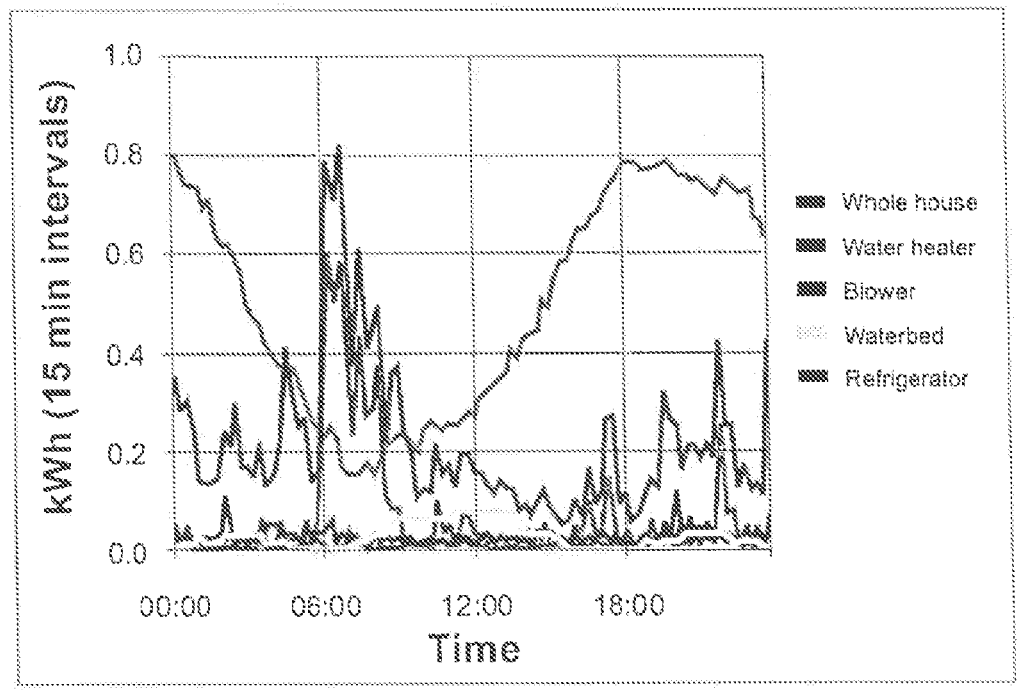
FIG. 4 is a simplified time diagram referring to details of measuring energy consumption according to a further embodiment of the invention.

FIG. 4 shows a measurement of energy consumption over time for different appliances, i.e. a water heater, a blower, a waterbed and a refrigerator. In addition the energy consumption of the complete household is depicted as well. Each appliance has certain characteristics with regard to power consumption over time. For instance, the water heater is consuming energy in the morning hours between 06:00 a.m. and 09:00 a.m. If the measurement unit 240, 340 detects the characteristic peaks of the water heater in the energy consumption of the complete household, the processor 240, 340 can determine that the water heater is switched on.

Figure 5:
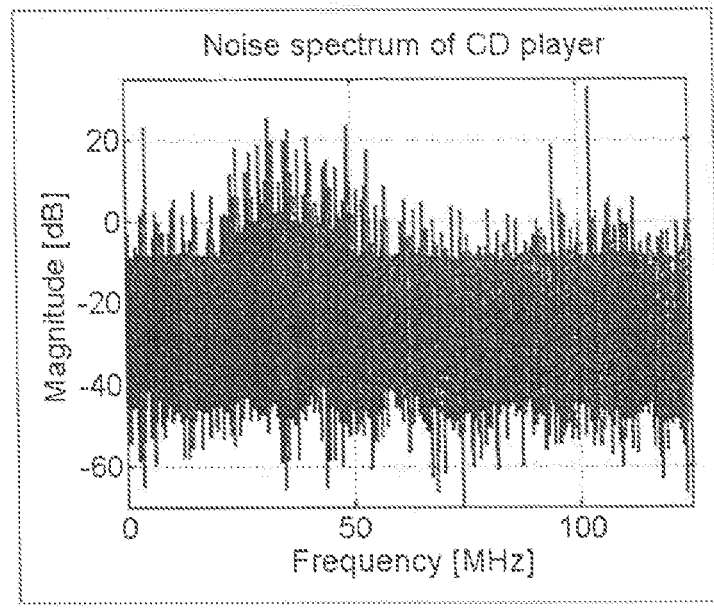
FIG. 5 is a simplified frequency diagram referring to details of measuring the noise spectrum of a CD player according to a further embodiment of the invention.

FIG. 5 shows a measured noise spectrum of a CD player. If the sensor 206, 300 detects this noise spectrum, the processor 240, 340 can determine that the CD player is switched on.

Figure 6:
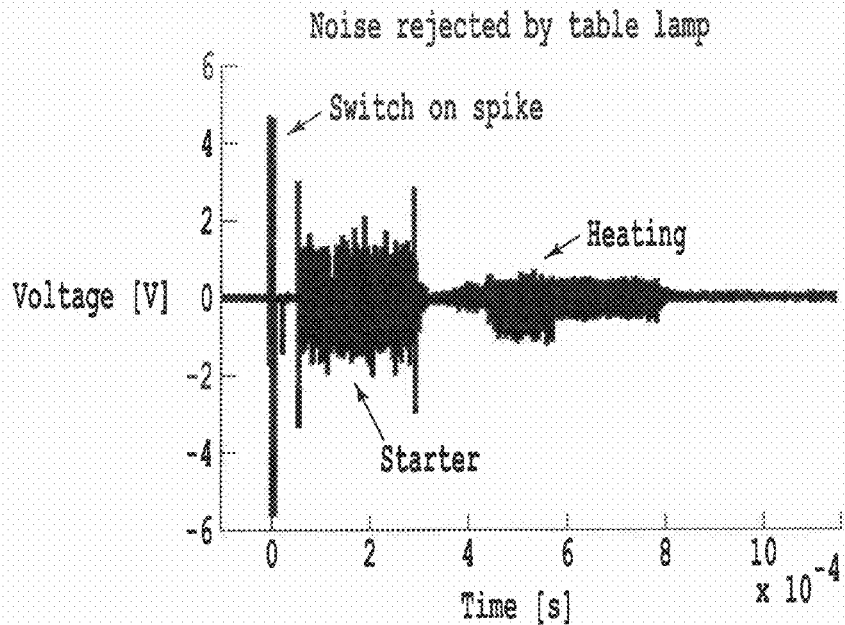
FIG. 6 is a simplified time diagram referring to details measuring the noise rejected by a table lamp according to a further embodiment of the invention.

FIG. 6 shows the measured voltage against time, if a halogen lamp as a table lamp is switched on. The voltage shows a peak, then for a duration of several milliseconds a noise of medium volume is noticeable, then another peak is measured followed by a decreasing noise level. If this timing electrical characteristic is measured it can be concluded that a halogen lamp is switched on. The first peak is caused by a switch-on impulse, the medium volume noise is generated by a starter unit and the second peak is caused by switching on the lamp. Noise caused by the lamp decreases when the lamp becomes heated. Such a noise scenario is nearly unique in a private building. It can be recorded at any outlet or socket of the mains grid 230. By characteristics of the timings of the individual transitions between the peaks and the noise levels even the manufacturer and a lamp type (power consumption, model number) might be identified.

In addition, the transfer function (in time or frequency domain) between two outlets might be measured. Between two outlets up to twelve transfer functions might be recorded. Similar to Multiple Input-Multiple Output power line communication (MIMO-PLC) signals can be fed symmetrically between the phase (P) line and the neutral (N) line, between phase (P) and protective earth (PE), and between neutral (N) and protective earth (PE). It might also be possible to feed common mode (CM) signals. Receiving of the signals can be performed identically to the feeding possibilities or feeding ports and in addition via the common mode (CM) signal. The real part and the imaginary part of the signal can be measured. The transfer function can be measured at a receive side from burst mode training symbols of power line communication systems. The transfer function can be obtained as well by a frequency or power sweep of an analog network analyzer. In addition, the transfer functions can be recorded between a pair of outlets or between multiple outlets. This measurement results in a grid view of all transfer functions.

Further, frequency intermodulations of signals fed into the mains grid 230 that are created by non-linear behavior within the network of the mains grid 230 or created by connected electrical devices might be measured as electrical characteristic.

Figure 7:
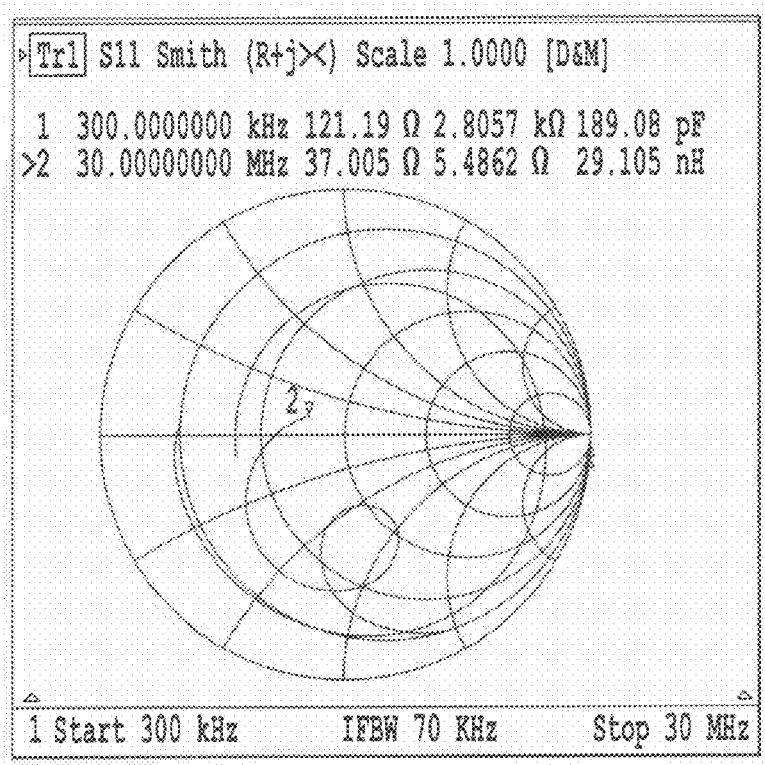
FIG. 7 is a simplified diagram referring to details measuring the reflection coefficient measured according to a further embodiment of the invention.

FIG. 7 shows measured scattering reflection parameter S11 or a device. Any device consuming high power has a low impedance from DC via 50 Hz up to a wide frequency range. A low power device will have a higher input impedance. Depending on the electrical components used for the device, the input impedance will have a capacitance or inductive characteristic.

It might be possible to measure the real part or the imaginary part of the input reflection coefficient. The reflection coefficient might be depending on the feeding signal level and the feeding might be performed according to the three possibilities mentioned above (i.e. phase-neutral P-N, phase-protective earth P-PE, neutral-protective earth N-PE), the reflected signals can be received via 4 channels (phase-neutral P-N, phase-protective earth P-PE, neutral-protective earth N-PE, common mode CM). This would result in monitoring of twelve reflection parameters and the measurement could be performed by a single sensor, with no further communication partner involved.

Figure 8A:
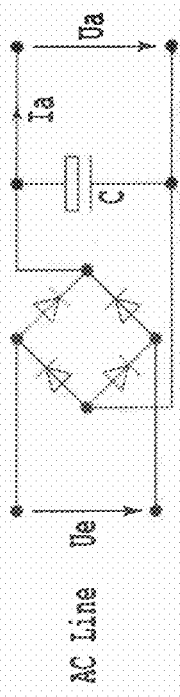
FIG. 8A shows a schematic circuit diagram according to a further embodiment of the invention.
Figure 8B:
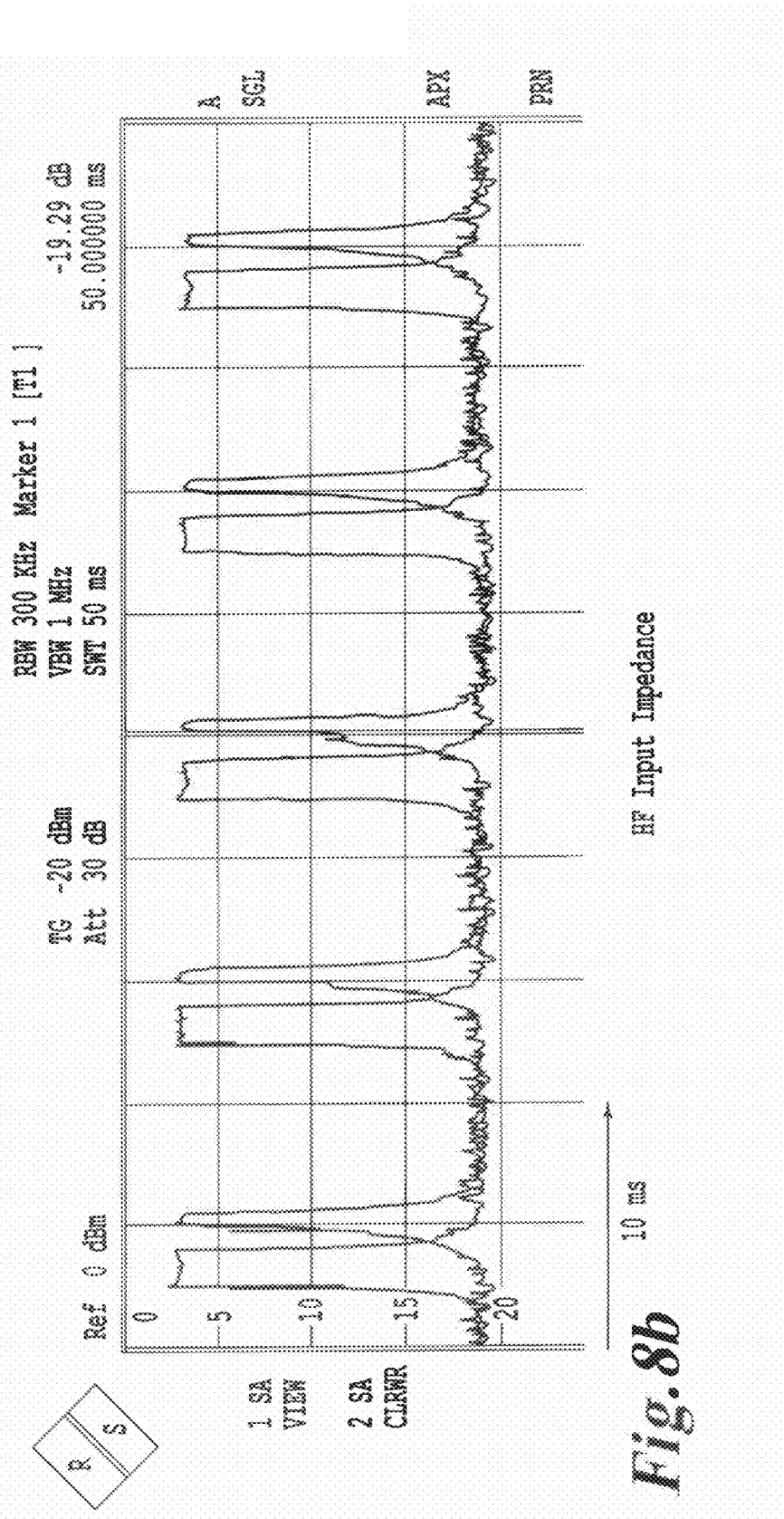
FIG. 8B is a simplified time diagram referring to details measuring input impedance according to still a further embodiment of the invention.

There are devices that vary their input impedance periodically with the line cycle on the mains grid 230. FIG. 8*a* shows a known measurement setup for measuring the input impedance. FIG. 8*b* shows the results of a scattering parameter or the time sweep measurement at the frequency f=23 MHz. A mobile phone charger was used as an impedance modulating device. It is visible that the channel changes are synchronous with the 50 Hz line cycle, because the period is 20 ms. The impedance of the device changes twice every line cycle period. One trace 810 is recorded with the batteries of the mobile phone fully charged. The other trace 800 is recorded with the batteries of the phone in charging mode, resulting in a higher load. The load consumed at Ua (cf. FIG. 8*a*) can be identified at the duty cycle of the two traces.

With the help of power line communication modems used as sensors 206, 300, also further measurements of electrical characteristics can be performed. For instance, the amplitude of the noise on four channels (P-N, P-PE, N-PE, CM) can be measured. Radiations can be measured by using an antenna connected to the power line communication modem. The noise is convolved with the transfer function between the electrical device to be identified and the measurement point, e.g. the socket 210 where the sensor 300, 206 is connected.

In addition, measurements with regard to the 50/60 Hz line cycle can be performed. For instance, timing variations can be determined, e.g. the jitter of zero crossings, dependency on locations at various outlets, or frequency intermodulations.

Further, the supply voltage at 50/60 Hz can be used to measure its amplitude or the change of the mains grid input impedance, when known loads are connected to the mains grid and the change of the supply voltage is measured.

For all electrical characteristics mentioned above, variations depending on frequency of time, e.g. within a 50/60 Hz cycle or over minutes or hours of runtime might be monitored.

For instance, if the impedance between the phase line (P) and the neutral line (N) becomes very low in a frequency range from DC (direct current) to several MHz, then a device have a low input impedance was connected. If it is determined further that the device consumes a large amount of power, it can be concluded that probably a heating device has been connected to the mains grid 230 or switched on.

Based on the information collected by measuring the above electrical characteristics of the home grid, a classifier is used which determines which electrical appliances are in use at any given time. The desired system output is therefore a list of active devices together with the time interval when the respective devices have been active, along with cumulative energy consumption of each of them. Such a system output can be used to reduce the total power consumption of a home, to increase energy effectiveness, and as a part of the small grid, by feeding back the—anonymized—information to a central grid control unit.

In order to compute a so-called "Appliance Activity List (AAL)" from the raw measurement data, machine learning technology is used. For example, an ordinary light bulb (Faraday type) will have no inductive or capacitive component to its resistivity, while a vacuum cleaner has corresponding inductive or capacitive components. A refrigerator has a characteristic temporal pattern, because an electric motor is periodically switched on and off. A washing machine has a different temporal pattern, where heating the water is done followed by activation of a motor, and so on. In order to be able to distinguish the devices from each other, offline learning is applied, where a set of different devices is monitored under controlled conditions, i.e. it is known when the washing machine is working etc. The characteristic signatures of the devices are obtained and stored into a database. During runtime, the measured signals are compared to the stored patterns in the database and the device can be recognized.

Additionally, localization of the devices in the home can be used. For example, if there are several measurement points spread throughout the house, it is advantageous to combine measurements from the various measurement points. More weight might be given to measurement data that has a close proximity to the electrical device in question, i.e. where the signal to noise ratio is small.

Figure 9:
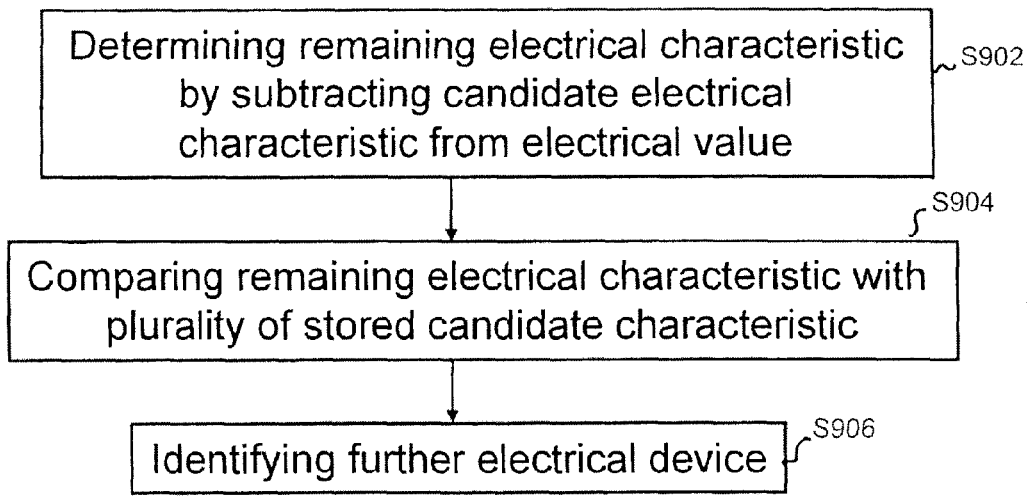
FIG. 9 is a simplified flow chart illustrating a method according to a further embodiment of the invention.

In FIG. 9 a schematic flow diagram depicting a method according to a further embodiment is depicted.

In step S902 a remaining electrical characteristic is determined by subtracting a candidate electrical characteristic from the measured electrical characteristic.

In step S904 the remaining electrical characteristic is compared with the plurality of stored candidate electrical characteristics.

In step S906 a further electrical device is identified based on the stored candidate electrical characteristic that is closest to the remaining electrical characteristic Once an electrical device is identified as active, its estimated pattern of activity is subtracted from the measurements. By this, the remaining signal can be further analyzed for additional events which might occur while one device is active. For example, a vacuum cleaner might be used while a dishwasher is running.

In practice, it might be appropriate to ask the user for some information. Such a user feedback will be necessary to assign proper names to devices; for example, to identify a resistor as "the light bulb in the attic" and another resistor as the "oven".

Since every home is different, and the situation with respect to active devices can be arbitrarily complex, it is impossible to predict the exact pattern of the measured signals. Therefore, a statistical classifier, like e.g. a support vector machine, should be used to do the actual classification. Temporal features, like the pattern of activity/inactivity, must be included into the input of the support vector machine. In addition, each deployed system should learn (update) its models while it is running. This can be done particularly in times when very few devices are active. For example, at nighttime, it is easy to get the pattern of the local fridge since there is not much disturbing other data. During busy times, the "clean" signal can be filtered out from the measurement data, or alternatively, a joint model can be constructed which models which devices are active over time. Such a model is constructed in such a way that the observed pattern of measurements is best explained by the hypothetical activity pattern of the devices.

Figure 10:
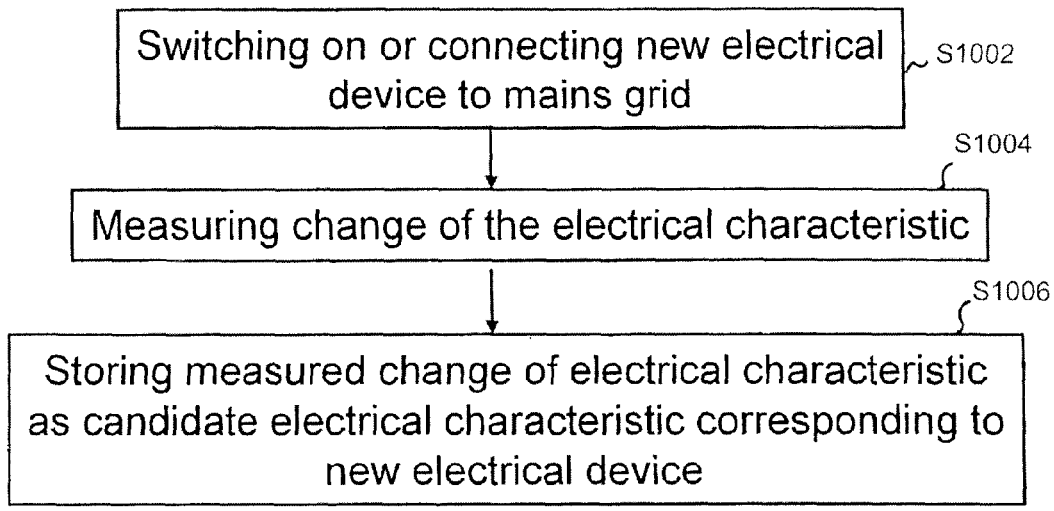
FIG. 10 is a simplified flow chart illustrating a method according to still a further embodiment of the invention.

In FIG. 10 a schematic flow diagram is depicted for a method according to a further embodiment of the invention.

In step S1002 a new electrical device is switched on or connected to the mains grid 230.

In step S1004 a change of the electrical characteristic is measured.

In step S1006 the measured change of the electrical characteristic is stored as a candidate electrical characteristic corresponding to the new electrical device.

The method as depicted in FIG. 10 might be appropriate to add new devices to the learning process, since a factory training process cannot cover all potential electrical appliances in a user's home. This learning process can be employed by having the user switch on the device for a minute, then switch it off again, and name it to the system. After such a learning stage, the device can be identified by the system.

All the information measured could further be used to identify users (inhabitants) behavior. Depending on changes of the habits of a users further actions might be created by the system, e.g. after the alarm bell was switched off early morning by the user, the coffee cooker might be switched on by the system or an emergency call might be triggered when a user does not leave the bed early morning. This behavior might be identified by the system because no appliance is used a predetermined time after the alarm bell was ringing.

The system might further be used to identify several speaker devices in a home or within a room. A HIFI stereo equipped with several speakers might be present, there is mobile phone lying on the table, a PSP (playstation portable) located on the couch, a radio device might be located in the kitchen, a door bell speaker system might be located in the entrance room, another HIHI stereo might be in children's room, etc. The combination of all speaker devices might be used for one surround acoustics application with many sound sources involved.

Although specific embodiments have been illustrated and described herein, it will be appreciated by those of ordinary skill in the art that a variety of alternate and/or equivalent implementations may be substituted for the specific embodiments shown and described without departing from the scope of the described embodiments. This application is intended to cover any adaptations or variations of the specific embodiments discussed herein. Therefore, it is intended that this invention be limited only by the claims and the equivalents thereof.

The invention claimed is:

1. A method for identifying an electrical device connected to a mains grid, the method comprising:
    measuring at least one electrical characteristic on the mains grid with a sensor removably attached to only a first socket of the mains grid and measuring the at least one electrical characteristic on the mains grid with another sensor removably attached to another socket different from the first socket, the at least one electrical characteristic corresponding to a plurality of electrical devices connected to a plurality of sockets, the plurality of electrical devices including the electrical device;
    assigning weights to the at least one electrical characteristic measured by the sensor and the another sensor based on a proximity of the plurality of electrical devices to the sensor and the another sensor, and combining the at least one electrical characteristic measured by the sensor and the another sensor based on the assigned weights;
    comparing the combined at least one electrical characteristic with a plurality of stored candidate electrical characteristics, each of the plurality of stored candidate electrical characteristics corresponding to one of a plurality of candidate electrical devices; and
    identifying the electrical device based on the combined at least one electrical characteristic and a stored candidate electrical characteristic, from the plurality of stored candidate electrical characteristics, that is closest to the combined at least one electrical characteristic,
    wherein the identified electrical device is connected to a second socket, of the plurality of sockets, different from the first socket.

2. The method according to claim 1, wherein the at least one electrical characteristic is measured for a predetermined time interval, and
    the stored candidate electrical characteristic specifies a time-dependency of the at least one electrical characteristic.

3. The method according to claim 1, further comprising:
    determining a remaining electrical characteristic by subtracting the stored candidate electrical characteristic from the combined at least one electrical characteristic;
    comparing the remaining electrical characteristic with the plurality of stored candidate electrical characteristics; and
    identifying another electrical device based on a second stored candidate electrical characteristic that is closest to the remaining electrical characteristic.

4. The method according to claim 1, further comprising:
    localizing the identified electrical device based on the stored candidate electrical characteristic that is closest to the combined at least one electrical characteristic.

5. The method according to claim 1, further comprising:
    determining which of the plurality of candidate electrical devices is in use at a given time, based on the stored candidate electrical characteristic that is closest to the combined at least one electrical characteristic and a statistical classifier.

6. The method according to claim 1, wherein the first socket is an alternating current (AC) power plug.

7. The method according to claim 1, further comprising:
    switching on or connecting a new electrical device to the mains grid;
    measuring a change of the at least one electrical characteristic; and
    storing the change of the at least one electrical characteristic as a candidate electrical characteristic corresponding to the new electrical device.

8. The method according to claim 7, further comprising:
    naming the new electrical device,
    wherein switching on and naming of the new electrical device is performed by a user.

9. The method according to claim 1, wherein the at least one electrical characteristic is one of: electrical power, real power, reactive power, apparent power, current, voltage, channel transfer function between any pair of sockets, frequency intermodulation, input reflection coefficient, noise, line cycle frequency, supply voltage at line cycle, and identification code.

10. The method according to claim 9, wherein the at least one electrical characteristic includes at least two different electrical characteristics.

11. A system for identifying an electrical device connected to a mains grid, the system comprising:
    a database including a plurality of stored candidate electrical characteristics each corresponding to one of a plurality of candidate electrical devices;
    a processor;
    a sensor including
        a connector configured to removably attach the sensor to only a first socket of the mains grid; and
        measurement circuitry configured to measure at least one electrical characteristic on the mains grid, the at least one electrical characteristic corresponding to a plurality of electrical devices connected to a plurality of sockets, the plurality of electrical devices including the electrical device; and
    another sensor including
        another connector configured to removably attach the another sensor to another socket different from the first socket of the mains grid; and
        another measurement circuitry configured to measure the at least one electrical characteristic on the mains gird, wherein
    the processor is configured to assign weights to the at least one electrical characteristic measured by the sensor and the another sensor based on a proximity of the plurality of electrical devices to the sensor and the another sensor, to combine the at least one electrical characteristic measured by the sensor and the another sensor based on the assigned weights, to compare the combined at least one electrical characteristic with the plurality of stored candidate electrical characteristics, and to identify the electrical device based on the combined at least one electrical characteristic and a stored candidate electrical characteristic, from the plurality of stored candidate electrical characteristics, that is closest to the combined at least one electrical characteristic, and
    the identified electrical device is connected to a second socket, of the plurality of sockets, different from the first socket.

12. The system according to claim 11, wherein the measurement circuitry is further configured to feed signals on the mains grid over one or more feeding ports chosen from symmetrically feeding between a phase line and a neutral line, feeding between the phase line and a protective earth line, and feeding between the neutral line and the protective earth line or to feed common mode signals.

13. The system according to claim 11, wherein the measurement circuitry is further configured to receive signals from the mains grid based on a common mode signal.

14. The system according to claim 11, further comprising:
    identification code circuitry configured to transmit an identification code over the mains grid to the sensor.

15. The system according to claim 11, wherein each of the plurality of stored candidate electrical characteristics corresponds to one of a plurality of candidate electrical devices.

16. The system according to claim 15, wherein the identified electrical device is selected from the plurality of candidate electrical devices.

17. A sensor system for identifying an electrical device connected to a mains grid, the sensor system comprising:
    measurement circuitry configured to measure at least one electrical characteristic on the mains grid with a sensor removably attached to only a first socket of the mains grid, the at least one electrical characteristic corresponding to a plurality of electrical devices connected to a plurality of sockets, the plurality of electrical devices including the electrical device;
    another measurement circuitry configured to measure the at least one electrical characteristic on the mains grid with another sensor removably attached to another socket different from the first socket; and
    a processor configured to assign weights to the at least one electrical characteristic measured by the sensor and the another sensor based on a proximity of the plurality of electrical devices to the sensor and the another sensor, to combine the at least one electrical characteristic measured by the sensor and the another sensor based on the assigned weights, to compare the combined at least one electrical characteristic with a plurality of stored candidate electrical characteristics, and to identify the electrical device based on the combined at least one electrical characteristic and a stored candidate electrical characteristic, from the plurality of stored candidate electrical characteristics, that is closest to the combined at least one electrical characteristic,
    wherein the identified electrical device is connected to a second socket, of the plurality of sockets, different from the first socket.

18. The sensor system according to claim 17, wherein the measurement circuitry is further configured to feed signals on the mains grid over one or more feeding ports chosen from symmetrically feeding between a phase line and a neutral line, feeding between the phase line and a protective earth line and feeding between the neutral line and the protective earth line or to feed common mode signals.

19. The sensor system according to claim 17, wherein the measurement circuitry is further configured to receive signals from the mains grid based on a common mode signal.

20. The sensor system according to claim 17, wherein each of the plurality of stored candidate electrical characteristics corresponds to one of a plurality of candidate electrical devices.

21. The sensor system according to claim 20, wherein the identified electrical device is selected from the plurality of candidate electrical devices.

* * * * *